United States Patent
Sun et al.

(10) Patent No.: US 7,910,933 B2
(45) Date of Patent: Mar. 22, 2011

(54) DUAL GATE LAYOUT FOR THIN FILM TRANSISTOR

(75) Inventors: Wein-Town Sun, Kaohsiung (TW);
Chun-Sheng Li, Kaohsiung (TW);
Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/469,298

(22) Filed: May 20, 2009

(65) Prior Publication Data

US 2009/0230403 A1    Sep. 17, 2009

Related U.S. Application Data

(62) Division of application No. 11/211,606, filed on Aug. 26, 2005, now Pat. No. 7,550,770, which is a division of application No. 10/624,479, filed on Jul. 23, 2003, now Pat. No. 6,936,848.

(30) Foreign Application Priority Data

Mar. 28, 2003   (TW) ................................ 92107167 A

(51) Int. Cl.
| | |
|---|---|
| H01L 29/04 | (2006.01) |
| H01L 29/15 | (2006.01) |
| H01L 31/036 | (2006.01) |
| H01L 29/10 | (2006.01) |
| H01L 31/0376 | (2006.01) |
| H01L 31/20 | (2006.01) |
| H01L 29/76 | (2006.01) |
| H01L 31/112 | (2006.01) |
| H01L 27/108 | (2006.01) |
| H01L 29/12 | (2006.01) |
| H01L 31/062 | (2006.01) |
| H01L 31/113 | (2006.01) |
| H01L 31/00 | (2006.01) |

(52) U.S. Cl. ................. 257/72; 257/57; 257/59; 257/66; 257/69; 257/291; 257/443; 257/E29.117; 257/E29.151; 257/E29.273; 257/E29.275

(58) Field of Classification Search .................... 257/59, 257/72, E29.117, E29.151, E29.273, E29.275, 257/57, 66, 69, 291, 443
See application file for complete search history.

(56) References Cited

U.S. PATENT DOCUMENTS

5,313,421 A    5/1994   Guterman et al.
(Continued)

FOREIGN PATENT DOCUMENTS

JP        2001117115        4/2001

OTHER PUBLICATIONS

Sun, et al, Non-Final Office Action, mailed Dec. 28, 2007, filing date Aug. 26, 2005, U.S. Appl. No. 11/211,606.

(Continued)

*Primary Examiner* — Ida M Soward
(74) *Attorney, Agent, or Firm* — Thomas, Kayden, Horstemeyer & Risley LLP

(57) ABSTRACT

A dual gate layout of a thin film transistor of liquid crystal display to alleviate dark current leakage is disclosed. The layout includes (1) a polysilicon on a substrate having a L-shaped or a snake shaped from top-view, which has a heavily doped source region, a first lightly doped region, a first gate channel, a second lightly doped region, a second gate channel, a third lightly doped region and a heavily doped drain region formed in order therein; (2) a gate oxide layer formed on the polysilicon layer and the substrate, (3) a gate metal layer then formed on the gate oxide layer having a scanning line and an extension portion with a L-shaped or an I-shaped. The gate metal intersects with the polysilicon layer thereto define the forgoing gate channels. Among of gate channels, at least one is along the signal line, which is connected to the source region through a source contact.

4 Claims, 4 Drawing Sheets

U.S. PATENT DOCUMENTS

| | | | |
|---|---|---|---|
| 5,693,959 A * | 12/1997 | Inoue et al. | 257/66 |
| 5,703,382 A * | 12/1997 | Hack et al. | 257/72 |
| 5,940,151 A | 8/1999 | Ha | |
| 6,163,310 A * | 12/2000 | Jinno et al. | 345/87 |
| 6,424,012 B1 * | 7/2002 | Kawasaki et al. | 257/350 |
| 6,573,955 B2 | 6/2003 | Murade | |
| 6,677,609 B2 * | 1/2004 | Inoue | 257/59 |
| 6,713,748 B1 * | 3/2004 | Tsutsumi et al. | 250/208.1 |
| 6,831,295 B2 | 12/2004 | Tsubo | |
| 6,847,422 B2 * | 1/2005 | Zhang et al. | 349/106 |
| 6,897,477 B2 * | 5/2005 | Shibata et al. | 257/59 |
| 6,911,663 B2 * | 6/2005 | Inukai | 257/13 |
| 6,919,235 B1 * | 7/2005 | Yamazaki et al. | 438/149 |
| 6,952,023 B2 * | 10/2005 | Yamazaki et al. | 257/79 |
| 2003/0001157 A1 * | 1/2003 | Yamada et al. | 257/59 |
| 2003/0053791 A1 * | 3/2003 | Yoshida | 385/147 |
| 2007/0114532 A1 * | 5/2007 | Yamazaki et al. | 257/59 |
| 2008/0174710 A1 * | 7/2008 | Murakami et al. | 349/43 |
| 2009/0236606 A1 * | 9/2009 | Sun et al. | 257/72 |
| 2010/0090994 A1 * | 4/2010 | Tanaka et al. | 345/204 |

OTHER PUBLICATIONS

Sun, et al, Final Office Action, mailed Sep. 4, 2008, filing date Aug. 26, 2005, U.S. Appl. No. 11/211,606.

Sun, et al, Advisory Action, mailed Nov. 14, 2008, filing date Aug. 26, 2005, U.S. Appl. No. 11/211,606.

Sun, et al, Notice of Allowance and Fees Due, mailed Mar. 31, 2009, filing date Aug. 26, 2005, U.S. Appl. No. 11/211,606.

* cited by examiner

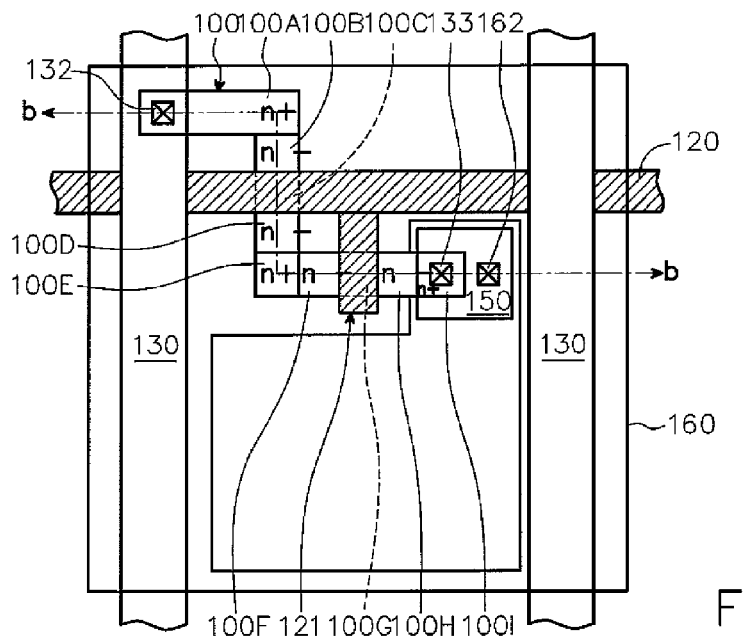
F I G . 2 A
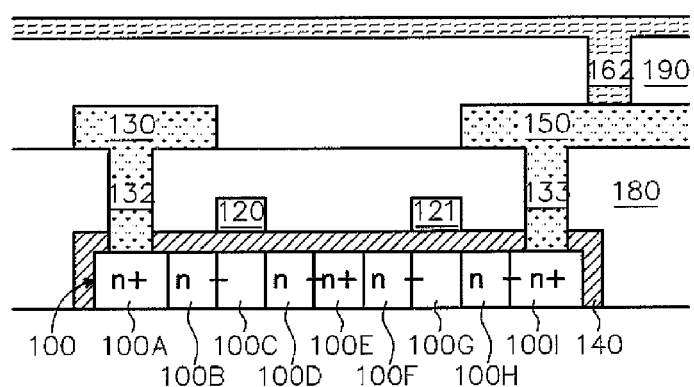
F I G . 2 B

US 7,910,933 B2

DUAL GATE LAYOUT FOR THIN FILM TRANSISTOR

RELATED APPLICATION

This application is a divisional application of prior application Ser. No. 11/211,606, which is filed on Aug. 26, 2005, as a divisional application of prior application Ser. No. 10/624,479, filed on Jul. 23, 2003, issued as U.S. Pat. No. 6,936,848 and are incorporated herein by reference.

FIELD OF THE INVENTION

The present invention relates to a dual gate structure of a thin film transistor for a liquid crystal display (LCD), and more particularly to a dual gate with at least one gate channel gate along a data line for low temperature polysilicon LTP LCDs so as to inhibit leakage current and provide picture resolution improvement process windows.

BACKGROUND OF THE INVENTION

A liquid crystal display (LCD) is a flat display with properties of low power consumption, low significantly, space occupation and weight in comparison with a conventional cathode ray tube (CRT) and without curve surface as a CRT display has. Hence, the liquid crystal display has widely been applied in all sorts of merchandises, including consumptive electronic products, such as pocket calculators, electronic dictionaries, watches, mobile phones, portable notebooks, communication terminals, display panels, desk-top personal computers, and even high dpi (dots per inch) television (HDTV) and so on. The most popular display is an active-type thin film transistor liquid crystal displays (TFT-LCD) due to the fact that the viewing angle, response time and the contrast performance are much better than that passive type LCD.

For a long term, amorphous silicon is a main material for TFT manufacture in TFT-LCD device. However, nowadays, another choice is provided, forming transistor using polysilicon is found superior to amorphous silicon. The low temperature polysilicon type TFT-LCD (LPTFT-LCD) may even become a main stream due to the better performance of carrier mobility in polysilicon than in amorphous. Another advantage of LPTFT-LCD had is the driving circuit can be formed simultaneously with the pixel TFT fabrication Therefore, LPTFT-LCD can provide a faster switched speed than other types LCD.

Certainly, LTP TFT-LCD has some drawbacks need to be overcome. For instance, the device usually has a rather large leakage current during TFT turn off. To overcome this defect, Inoue et al, proposed a concept of dual gate TFT structure to inhibit the problem of leakage current. Please refer to the reference, U.S. Pat. No. 5,693,959. Another method is provided by Ha et al in U.S. Pat. No. 5,940,151; the patent provides lightly doped drain (LDD) technique to alleviate the leakage current problem.

The present invention concentrates to the dual gate structure of TFT. Please refer to FIG. 1A, a top view, and the cross-sectional view in FIG. 1B, which is viewed along cutline a-a' of FIG. 1A. The numeral 909 is denoted a polysilicon layer, which is formed to constitute a heavily doped source region 909a, a lightly doped source region 909b, a first channel 909c, a lightly doped region 909d, which is in between dual gate, a second channel 909d, a second channel 909e, a lightly doped drain region 909f, and a heavily doped drain region 909g. The scan line 903 includes dual gates, one over the first channel 909c and the other over the second channel 909e. The signal line 904 usually made of aluminum is contacted to the heavily doped source region 909a through source contact 910. The drain metal line is connected to a transparent conductive electrode by mean of through-hole 913 and drain contact 911 to the heavily doped drain region 909g.

The forgoing dual gate provided two gates in parallel and formed along the scan line. Unfortunately, in the design of color filter layout, the primary colors: red, blue, and green are usually along scan line. As a result, the resolution of display will suffer some limits. Since, the total lengths of two channel 909c, 909e and the interval in between 909d will be restricted owe to the constraints of lithographic machine for TFT. Since the problem of the pixel is crowded along scan line direction. However, there is no such problem along the data line. Three sub-pixels for three primary colors are not along this direction. By contrast, it provides more process windows. Subsequently, an object of the present invention is to provide a method, which is to reshuffle the positions of the dual gate. Some or part of the loadings of dual gate on the scanning line is shared by the signal line and thus solve the forgoing problem.

SUMMARY OF THE INVENTION

The primary object of the present invention is to provide a TFT with a dual gate structure for a low temperature polysilicon LCD to inhibit current leakage.

The second object of the present invention is to improve the issue of about conventional dual gate structure, which both of the gates are along scanning line that inferior to the high resolution.

Five preferred embodiment are disclosed. In the first preferred embodiment, a polycrystalline silicon having a stair shaped in geometry from top view formed on a substrate for a source region, a first doped region, a first gate channel, a second doped region, a second gate channel, a third doped region, and a drain region formation. The polycrystalline silicon layer having a vertical section and a horizontal section intersect, respectively, with a scanning line, and an I-shaped extension portion thereof to form a first gate channel and a second gate channel.

In the second preferred embodiment, the polycrystalline silicon having a L-shaped in geometry from top view formed on a substrate for a source region at an end of horizontal section, a first doped region, a first gate channel, a second doped region, a second gate channel, a third doped region, and a drain region at an end of vertical section formation. The polycrystalline silicon layer having a vertical portion intersects with a scanning line, and a horizontal portion of L-shaped extension portion to form a first gate channel and a second gate channel.

In the third preferred embodiment, the polycrystalline silicon having a L-shaped in geometry from top view formed on a substrate for a source region at an end of horizontal section, a first doped region, a first gate channel, a second doped region, a second gate channel, a third doped region, and a drain region at an end of vertical section formation. The polycrystalline silicon layer having a horizontal section and a vertical section intersect, respectively, with an I-shaped extension portion and scanning line to form a first gate channel and a second gate channel.

In the fourth preferred embodiment, the polycrystalline silicon having a L-shaped in geometry from top view formed on a substrate for a source region at an end of horizontal section, a first doped region, a first gate channel, a second doped region, a second gate channel, a third doped region, and a drain region at an end of vertical section formation. The polycrystalline silicon whose vertical section intersects with a scanning line and a horizontal portion of L-mirror shaped extension portion to form a first gate channel and a second gate channel.

In the fifth preferred embodiment, the polycrystalline silicon having a L-shaped in geometry from top view formed on a substrate for a source region at an end of horizontal section, a first doped region, a first gate channel, a second doped region, a second gate channel, a third doped region, and a drain region at an end of vertical section formation. The polycrystalline silicon layer having a horizontal section and a vertical section intersect, respectively, with a vertical section and a horizontal section of a shaped extension portion to form a first gate channel and a second gate channel.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2A is a plan view illustrating a dual gate structure of a TFT-LCD in accordance with the first preferred embodiment of the present invention.

FIG. 2B is a cross-sectional view illustrating a dual gate structure of a TFT-LCD in accordance with the first preferred embodiment of the present invention.

DESCRIPTION OF THE PREFERRED EMBODIMENTS

In addition to large scales is a generic trend for LCD monitors or LCD television, another trend is to raise the resolutions so as to improve the picture quality. Due to the dark leakage current problem, dual gate is a common approaching to solve the leakage current of LTP TFT LCD. However, conventional dual gate structure is detrimental to the resolution improvement because the dual gates are common formed along the scanning line. The structure of the present invention disclosed can resolve such problem.

The following description is presented to enable one of ordinary skill in the art to make and use the invention and is provided in the context of a patent application and its requirement. Various modifications to the preferred embodiment and generic principles and features described herein will be readily apparent to those skilled in the art. Thus, the present invention is not intended to be limited to the embodiment shown but is to be accorded the widest scope consistent with the principles and features described herein. For example, the present invention will be described in the context of using n-type conductive impurities which is just for illustrating convenience, one of ordinary skill in the art will readily recognize that p-type impurities could be here. And its use would be within the sprit and scope of the present invention.

The present invention proposed several embodiments and will be described as follows:

According to the first preferred embodiment, referring to FIG. 2A, a top view for one pixel layout. The polycrystalline silicon layer 100 formed on the glass substrate presents as a stair-shaped having regions including 100A, 100B,100C, 100D, 100E, 100F, 100G, 100H, and 100I. The stair-shaped polycrystalline silicon layer 100 intersects with the scanning line 120 and its I-shaped extension portion 121 by two regions . . . layer 190.

The geometry of regions 100D, 100E, and 100F presented as right angle distributed, as is shown in the figure. It is not intended to limit the claim scope. It can be other geometry, for example they can be presented as arc-shaped or a shortest line between the channels 100 C and 100G.

Figure 1A:
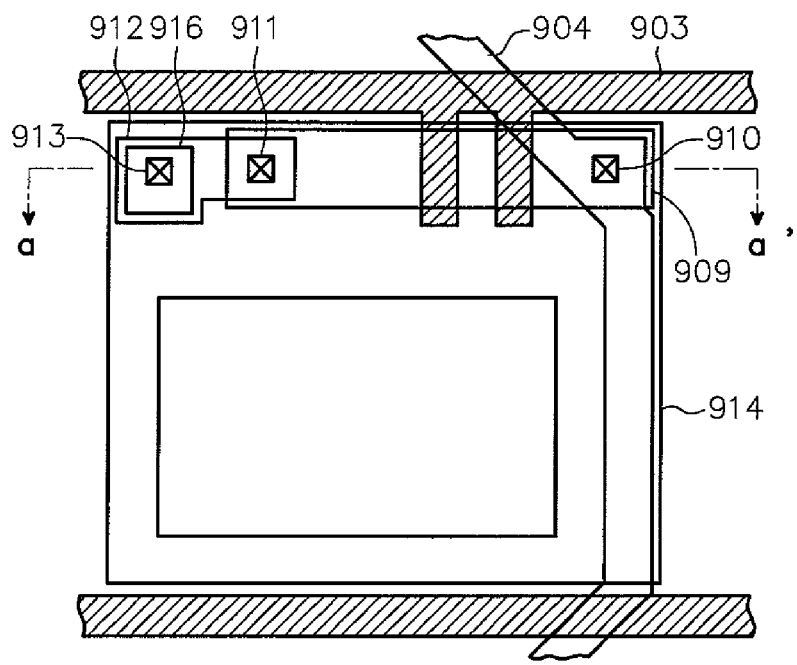
FIG. 1A is a plan view illustrating a dual gate structure of a TFT-LCD in accordance with the current invention.
Figure 1B:
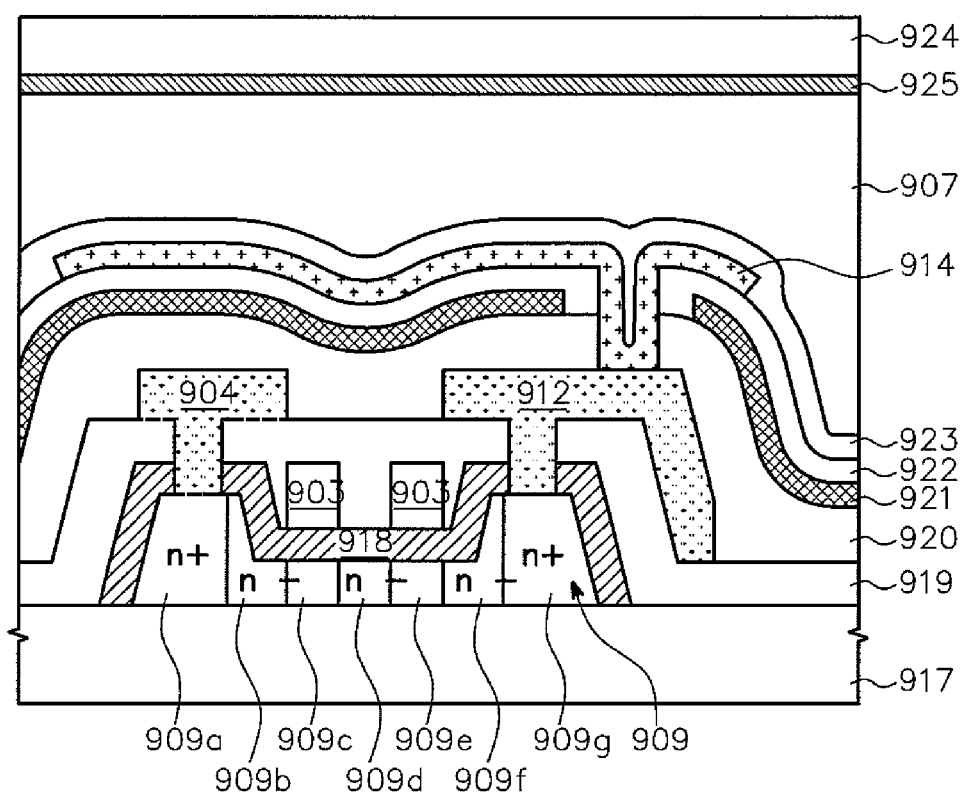
FIG. 1B is a cross-sectional view illustrating a dual gate structure of a TFT-LCD in accordance with the current invention.
Figure 3:
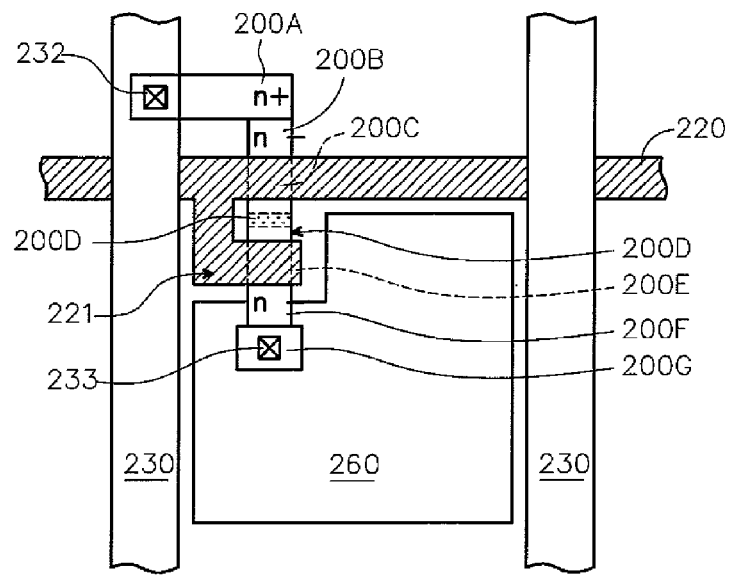
FIG. 3 is a plan view illustrating a dual gate structure of a TFT-LCD in accordance with the second preferred embodiment of the present invention.

The second preferred embodiment is shown in FIG. 3, a top view. The polycrystalline silicon layer 200 formed on the glass substrate presents as a L-shaped having regions including 200A, 200B,200C, 200D, 200E, 200F, and 200G. The L-shaped polycrystalline silicon layer 200 intersects with the scanning line 220 and its L-shaped extension portion by two regions. One is formed as the first channel 200C, and the other is the second channel 200E. As aforementioned in the first preferred embodiment, an insulating layer is formed before forming gate metal layer 220. the regions abutting both sides of the first channel 200C and the second channel 200E are n-type lightly doped regions 200B, 200D and 200D, 200F, respectively. Still, the n+ heavily doped source region 200A is contacted with the metal data line 230 through contact windows 232. The n+ heavily doped drain region 200G is contacted with the storage capacitor (not shown), the first interconnect line (not shown) and the transparent conductive electrode 260. The detailed descriptions are as first preferred embodiment.

Worthwhile if the channel 200C does not distant from the channel 200E, one n-lightly doped region 200D formed is enough. However, the n-lightly doped region 200D can also have a heavily doped region 200D' in it to reduce resistance.

Figure 4:
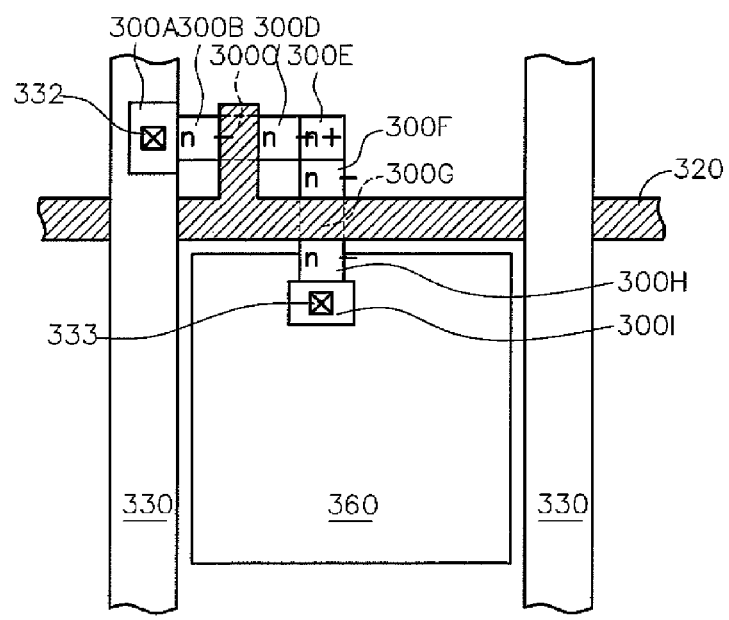
FIG. 4 is a plan view illustrating a dual gate structure of a TFT-LCD in accordance with the third preferred embodiment of the present invention.

The third preferred embodiment is shown in FIG. 4, a top view. The polycrystalline silicon layer 300 formed on the glass substrate presents as a L-shaped having regions including 300A, 300B,300C, 300D, 300E, 300F, 300G, 300H, and 300I The L-shaped polycrystalline silicon layer 300 intersect with the scanning line 320 and its I-shaped extension portion 321 by two regions. One is formed as the first channel 300C, and the other is the second channel 300G. As aforementioned in the first preferred embodiment, an insulating layer is formed before forming gate metal layer 320. The regions abutting both sides of the first channel 300C and the second channel 300G are n-type lightly doped regions300B, 300D and 300F, 300H, respectively. Still, the n+ heavily doped source region 300A is contacted with the metal data line 330 through contact windows 332. The n+ heavily doped drain region 300I is contacted with the storage capacitor (not shown), the first interconnect line (not shown) and the transparent conductive electrode 360.

Similarly, the geometry of regions 300D, 300E, and 300F presented as right angle distributed is not necessary. It can be other geometry, for example they can be presented as arc-shaped or a shortest line between the channels 300 C and 300G. Furthermore, if the channel 300c does not distant from the channel 300G, for example, less than 1 μm, 1 n-lightly doped region 300D formed is enough. Otherwise, it should have an extra heavily doped region to reduce resistance.

Figure 5:
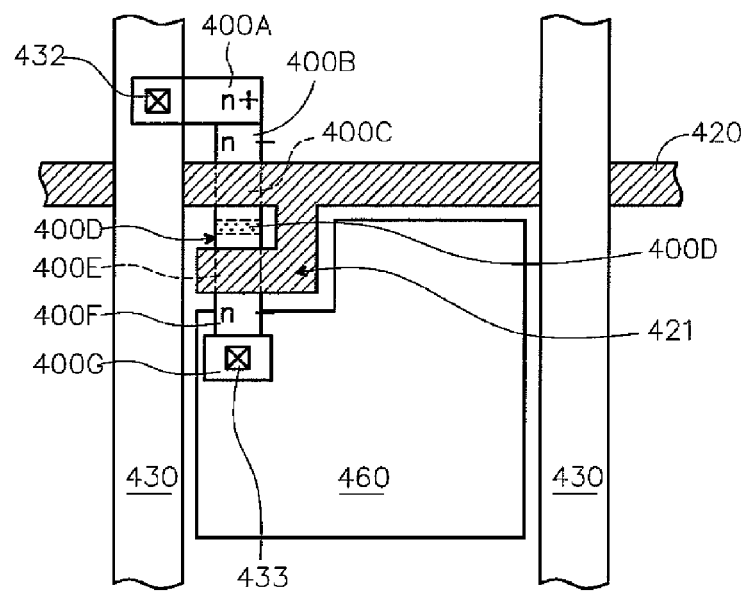
FIG. 5 is a plan view illustrating a dual gate structure of a TFT-LCD in accordance with the fourth preferred embodiment of the present invention.

The fourth preferred embodiment is shown in FIG. 5, a top view. The polycrystalline silicon layer 400 formed on the glass substrate presents as a L-shaped having regions including 400A, 400B, 400C, 400D, 400E, 400F, and 400G. The L-shaped polycrystalline silicon layer 400 intersects with the scanning line 420 and its L-mirror-shaped extension portion 421 by two regions. One is formed as the first channel 400C and the other is the second channel 400E. Basically, the fourth preferred embodiment is similar to the second preferred embodiment except, the extension portion of the scanning line is L-mirror-shaped in geometry. Thus, they need not be described in detail. Similarly, as disclosed in the above embodiments, if the distance between the first channel 400C and the second channel 400E is small, only n-lightly doped region 400D formed therebetween is enough. However, the n-lightly doped region 400D can also have a heavily doped region disposed in the middle of the n-lightly doped region 400D to reduce resistance.

Figure 6:
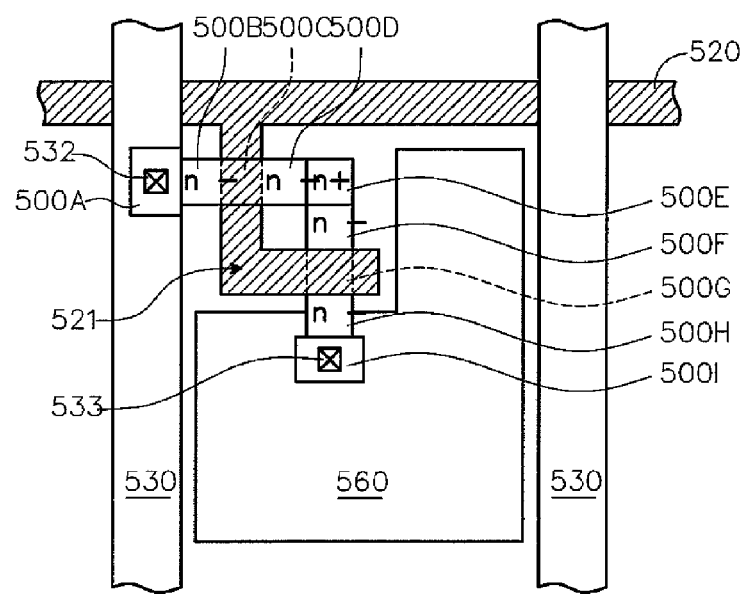
FIG. 6 is a plan view illustrating a dual gate structure of a TFT-LCD in accordance with the sixth preferred embodiment of the present invention.

The fifth preferred embodiment is shown in FIG. 6, a top view for a pixel. The polycrystalline silicon layer 500 formed on the glass substrate presents as a L-shaped having regions including 500A, 500B, 500C, 500D, 500E, 500F, 500G, 500H, and 500I The L-shaped polycrystalline silicon layer 500 intersect with the scanning line 520 and its L-shaped extension portion 521 by two regions. One is formed as the first channel 500C, the other is the second channel 500G. The regions abutting both sides of the first channel 500C and the second channel 500G are n-type lightly doped regions 500B, 500D, and 500F, 500H, respectively. Still, the n+ heavily doped source region 500A is contacted with the metal data line 530 through contact windows 532. The n+ heavily doped drain region 500I is contacted with the storage capacitor (not shown), the first interconnect line (not shown) and the transparent conductive electrode 560, as aforesaid in the first preferred embodiment.

The benefit of the present invention provided is:

The dual gate structure of the TFT according to the present invention at least one gate channel is along data line direction. As a result, more pixels can be set along the scanning line and thus the picture resolution can be elevated.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure

What is claimed is:

1. A structure of a multi-gate thin film transistor (TFT) for an LCD, comprising:
a polycrystalline silicon layer formed on a substrate having a horizontal section and a vertical section, wherein the horizontal section includes a source region, and the vertical section is formed sequentially with a first doped region, a first gate channel, a second doped region, a second gate channel, a third doped region, and a drain region, wherein the source region connects with the first doped region and the drain region is disposed at an end of the vertical section;
a multi-gate, including a portion of a scanning line and an extension portion in every pixel formed on said substrate, wherein said extension portion has a vertical portion extending from the portion of the scanning line and a horizontal portion extending from an end of the vertical portion toward a source line, and the portion of the scanning line and the horizontal portion intersected with said vertical section of said polycrystalline silicon layer where the first gate channel and the second gate channel are disposed, respectively; and
a gate oxide layer formed in between said multi-gate and said polycrystalline silicon layer.

2. The structure of a multi-gate thin film transistor (TFT) for an LCD according to claim 1, wherein said first doped region, said second doped region and said third doped region are lightly doped impurity regions.

3. The structure of a multi-gate thin film transistor (TFT) for an LCD according to claim 1, wherein the middle of said second doped region has a heavily doped impurity region.

4. A structure of a multi-gate thin film transistor (TFT) for an LCD, comprising:
a polycrystalline silicon layer having a horizontal section and a vertical section, wherein the first horizontal section is parallel with a scanning line, and the vertical section is parallel with a data line and across the scanning line;
a multi-gate, including a portion of a scanning line and an extension portion in every pixel formed on said substrate, wherein said extension portion has a vertical portion extending from the portion of the scanning line and a horizontal portion extending from an end of the vertical portion toward a source line, and the portion of the scanning line and the horizontal portion intersected with said vertical section of said polycrystalline silicon layer to form a first gate channel and a second gate channel in the polycrystalline silicon layer, respectively; and
a gate oxide layer formed in between said multi-gate and said polycrystalline silicon layer.

* * * * *